United States Patent
Gomi

(10) Patent No.: US 7,944,144 B2
(45) Date of Patent: May 17, 2011

(54) ORGANIC ELECTROLUMINESCENCE DEVICE WITH SEALING GLASS PORTIONS AND SEALING RESIN PORTIONS AND METHOD FOR PRODUCING ORGANIC ELECTROLUMINESCENCE DEVICE

(75) Inventor: Tsugio Gomi, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 42 days.

(21) Appl. No.: 12/412,950

(22) Filed: Mar. 27, 2009

(65) Prior Publication Data

US 2009/0261726 A1 Oct. 22, 2009

(30) Foreign Application Priority Data

Apr. 16, 2008 (JP) ................. 2008-106720

(51) Int. Cl.
*H01J 1/62* (2006.01)
*H01J 63/04* (2006.01)
(52) U.S. Cl. ........ 313/512; 313/498; 313/504; 313/506; 445/24
(58) Field of Classification Search .......... 313/498–512; 445/24–25
See application file for complete search history.

(56) References Cited

U.S. PATENT DOCUMENTS

| | | | | |
|---|---|---|---|---|
| 2003/0122476 A1* | 7/2003 | Wang et al. | .................... | 313/493 |
| 2005/0189877 A1* | 9/2005 | Ishida | ............................ | 313/512 |
| 2006/0152153 A1* | 7/2006 | Hayashi | ........................ | 313/512 |
| 2007/0170861 A1* | 7/2007 | Lee et al. | ........................ | 313/512 |
| 2007/0290609 A1* | 12/2007 | Ishii et al. | ...................... | 313/504 |
| 2008/0007163 A1* | 1/2008 | Matsuura et al. | ............. | 313/504 |
| 2008/0054800 A1* | 3/2008 | Oooka et al. | .................. | 313/504 |
| 2008/0175605 A1* | 7/2008 | Sakurai | ............................. | 399/4 |
| 2008/0211393 A1* | 9/2008 | Yaegashi | ........................ | 313/504 |
| 2008/0238311 A1* | 10/2008 | Sung et al. | .................... | 313/512 |
| 2008/0303418 A1* | 12/2008 | Fujita et al. | ................... | 313/504 |
| 2009/0039780 A1* | 2/2009 | Kim et al. | ...................... | 313/512 |
| 2009/0066243 A1* | 3/2009 | Sakurai | ............................. | 313/512 |

FOREIGN PATENT DOCUMENTS

| | | |
|---|---|---|
| EP | 1 811 589 A2 | 7/2007 |
| EP | 1 925 601 A1 | 5/2008 |
| JP | A-2001-319775 | 11/2001 |

* cited by examiner

*Primary Examiner* — Joseph L Williams
*Assistant Examiner* — Kevin Quarterman
(74) *Attorney, Agent, or Firm* — Oliff & Berridge PLC

(57) ABSTRACT

An organic electroluminescence device, includes: an element substrate; a light emitting unit formed on the element substrate; a sealing substrate; and a sealing portion surrounding at least the light emitting unit and disposed between the element substrate and the sealing substrate, the sealing portion having sealing glass portions and sealing resin portions.

13 Claims, 12 Drawing Sheets

ORGANIC ELECTROLUMINESCENCE DEVICE WITH SEALING GLASS PORTIONS AND SEALING RESIN PORTIONS AND METHOD FOR PRODUCING ORGANIC ELECTROLUMINESCENCE DEVICE

BACKGROUND

1. Technical Field

The present invention relates to an organic electroluminescence device and a method for producing the organic electroluminescence device.

2. Related Art

In recent years, the need for flat display devices having reduced power consumption and a reduced weight has been growing with diversification of information technology devices, for example. As one of such flat display devices, an organic electroluminescence (hereinafter referred to as "organic EL") device has been proposed in which display is performed by making an organic EL element having an organic function layer, such as a light emitting layer or a hole transporting layer emit light.

The organic EL element deteriorates, brightness decreases, and emission life becomes short due to contact with moisture or oxygen in the air. Therefore, as a structure of the organic EL device, a structure is employed in which the organic EL element is disposed between a pair of substrates facing each other, and the peripheries of the substrates are adhered with an adhesive, so that moisture or oxygen is prevented from entering the inside of the organic EL device. In a process of bonding the substrates, which is one of the processes of producing the organic EL device, a pair of substrates are bonded to each other in a nitrogen atmosphere. Therefore, in the inside of the organic EL device, the organic EL element is disposed in a nitrogen atmosphere from which moisture or oxygen has been removed.

As a structure in which the organic EL element is sealed in the organic EL device, a structure is generally known in which the peripheries of the pair of substrates are sealed using a resin adhesive. In recent years, a sealing structure has been proposed in which the outer periphery of the organic EL element is completely sealed using a glass paste in which powdery glass frit has been mixed with a resin paste (e.g., JP-A-2001-319775).

However, a glass material is easily broken when a stress is applied. More specifically, a glass material has a disadvantage that resistance against an external stress is low. Therefore, the sealing structure disclosed in JP-A-2001-319775 has a problem that, in the case where a driver circuit or the like is mounted on a substrate or when a substrate is transported, for example, when an external stress is applied to the substrate, the substrate bends, causing cracks or separation in the glass sealing structure.

SUMMARY

An advantage of some aspects of the invention is that it provides an organic EL device in which resistance against an external stress is high and high sealing properties against moisture or oxygen are obtained, and a method for producing the organic EL device.

An organic EL device according to a first aspect and a second aspect of the invention is an organic EL device in which sealing substrates are bonded to each other through a sealing portion on an element substrate on which a light emitting unit is formed, in which the sealing portion is formed into a rectangular shape by connecting sealing glass portions and sealing resin portions each having end portions.

Here, the sealing glass portions have an advantage of excellent sealing properties against moisture or oxygen. The sealing resin portion has an advantage of reducing an external stress due to flexibility, and thus having excellent resistance against a stress.

Therefore, according to the first aspect and the second aspect of the invention, due to the sealing portion containing the sealing glass portions and the sealing resin portions, an organic EL device can be achieved in which high sealing properties are obtained, the development of cracks or separation resulting from an external stress is prevented, and resistance against an external stress is obtained.

More specifically, according to a third aspect of the invention, an organic EL device having high sealing properties compared with a former sealing structure containing a resin adhesive alone can be achieved. According to an aspect of the invention, an organic EL device having high resistance against an external stress compared with a sealing structure containing a glass material alone as disclosed in JP-A-2001-319775. More specifically, according to an aspect of the invention, an organic EL device having a sealing portion having a sealing structure in which both resistance against an external stress and sealing properties against moisture or oxygen are obtained can be achieved.

Therefore, an organic EL device can be achieved in which deterioration of an element, reduction in brightness, and shortening of emission life resulting from contact of a light emitting unit with moisture or oxygen in the air are suppressed and resistance against an external stress is obtained.

In the organic EL device according to a third aspect of the invention, it is preferable that the sealing resin portion be provided to at least one portion in each of two sides facing each other of the sealing portion formed into the rectangular shape.

Thus, the sealing portion having the sealing resin portions in each of the two sides of the rectangular shape is applied to an organic EL device which easily bends in either one of the longitudinal direction of the substrate and a transverse direction of the substrate.

With the structure, an external stress generated in each of the two sides facing each other can be reduced by the sealing resin portions.

In the organic EL device according to a fourth aspect of the invention, it is preferable that the sealing portion formed into the rectangular shape have long sides facing each other and short sides facing each other and that the sealing resin portion be provided to at least one portion in each of the long sides.

Moreover, it is preferable that, at the short sides, the sealing resin portion be not provided and the sealing glass portion alone be provided.

Thus, the sealing portion having the long sides and the short sides is applied to an organic EL device containing a long and narrow element substrate and a long and narrow sealing substrate. In the organic EL device having a long and narrow shape, when an external stress is applied, the device easily bends in the long side direction and hardly bends in the short side direction.

With structure, in the organic EL device having a long and narrow shape, an external stress generated in each of the long sides can be reduced by the sealing resin portions. Moreover, the sealing properties of the short sides can be increased.

In the organic EL device according to a fifth aspect of the invention, it is preferable that the sealing resin portion be provided to at least one portion of each of four sides of the sealing portion formed into the rectangular shape.

Thus, the sealing portion having the sealing resin portions in each of the four sides of the rectangular shape is applied to an organic EL device which easily bends in each of the longitudinal direction of the substrate and the transverse direction of the substrate.

With the structure, an external stress generated in each of the four sides can be reduced by the sealing resin portions.

In the organic EL device according to a sixth aspect of the invention, it is preferable that the sealing resin portions be provided to four corners of the sealing portion formed into the rectangular shape.

When an external stress is applied to the sealing portion formed into the rectangular shape, a stress is concentrated on the four corners of the sealing portion rather than the sealing portion linearly extending.

With the structure, an external stress generated in the four corners of the sealing portion on which a stress is easily concentrated can be reduced by the sealing resin portions. Moreover, with the structure, an external stress generated in the diagonal direction of the sealing portion formed into the rectangular shape can be reduced.

In the organic EL device according to a seventh aspect of the invention, it is preferable that the sealing glass portions disposed at both sides of the sealing resin portions be equal in length.

With the structure, external stresses generated in the sealing glass portions disposed at both sides of the sealing resin portions become equal to each other and the external stresses generated in the sealing glass portions can be reduced by the sealing resin portions.

When the sealing resin portions are disposed so that a plurality of sealing glass portions forming the sealing portion are equal in length, stresses are generated in the plurality of sealing glass portions become equal to each other, and external stresses generated in the sealing glass portions can be reduced by the sealing resin portions.

In the organic EL device according to an eighth aspect of the invention, it is preferable that a desiccant be disposed in a space sealed by the sealing portion between the element substrate and the sealing substrate.

With the structure, the space formed between the element substrate and the sealing substrate is maintained in a dry state. Therefore, a light emitting unit formed between the element substrate and the sealing substrate can be maintained in a dry state, thereby suppressing deterioration of the light emitting unit, reduction in brightness, and shortening of emission life.

A method for producing an organic EL device according to a ninth aspect of the invention, including: forming a light emitting unit on an element substrate; forming sealing glass portions having end portions on a sealing substrate at a given interval; bonding the element substrate and the sealing substrate in such a manner that a side of the element substrate on which the light emitting unit is formed faces the sealing substrate; and forming sealing resin portions between the sealing glass portions which are adjacent to each other in the state where the element substrate and the sealing substrate are bonded to each other, in which the sealing portion containing the sealing glass portions and the sealing resin portions is formed into a rectangular shape, and the light emitting unit is sealed between the element substrate and the sealing substrate.

According to the ninth aspect of the invention, an organic EL device equipped with a sealing portion having a sealing structure in which both resistance against an external stress and sealing properties against moisture or oxygen can be produced.

Therefore, an organic EL device can be produced in which deterioration of an element, reduction in brightness, and shortening of emission life resulting from contact of the light emitting unit with moisture or oxygen in the air are suppressed and resistance against an external stress is obtained.

In the method for producing an organic EL device according to a tenth aspect of the invention, it is preferable for the process of forming the sealing glass portions on the sealing substrate to include a process of disposing glass resin materials containing a glass material at a given interval on the sealing substrate, and then curing the glass resin materials.

According to the method, the sealing glass portions can be formed by curing the glass resin materials after the glass resin materials are disposed on the sealing substrate.

In the method for producing an organic EL device according to an eleventh aspect of the invention, it is preferable for the process of bonding the element substrate and the sealing substrate to include melt-bonding the element substrate and the sealing substrate by irradiating the sealing glass portions with laser light in the state where the element substrate and the sealing substrate are bonded to each other.

According to the method, the element substrate and the sealing substrate can be melt-bonded by irradiating the sealing glass portions with laser light to melt the sealing glass portions held between the element substrate and the sealing substrate, and then curing the sealing glass portions.

In the method for producing an organic EL device according to a twelfth aspect of the invention, it is preferable that the sealing glass portions be colored.

According to the method, laser light is emitted to the colored sealing glass portions. Therefore, the light energy of the laser light is absorbed into the sealing glass portions to efficiently melt the sealing glass portions, whereby the element substrate and the sealing substrate can be certainly melt-bonded.

In the method for producing an organic EL device according to a thirteenth aspect of the invention, it is preferable for the sealing glass portions to contain a transition metal.

According to the method, laser light is emitted to the sealing glass portions containing a transition metal. Since the melting point of the sealing glass portions containing a transition metal is low, the sealing glass portions can be melted with a small amount of light energy, thereby certainly melt-bonding the element substrate and the sealing substrate.

In the method for producing an organic EL device according to a fourteenth aspect of the invention, it is preferable for the process of forming the sealing resin portions to include disposing a liquid resin adhesive between the sealing glass portions which are adjacent to each other, and then curing the resin adhesive.

According to the method, the liquid resin adhesive flows to between the sealing glass portions held between the element substrate and the sealing substrate due to the action of surface tension, and stays between the sealing glass portions. Therefore, the liquid resin adhesive can be certainly disposed between the sealing glass portions, and then, by curing the resin adhesive, the sealing resin portions can be formed.

BRIEF DESCRIPTION OF THE DRAWINGS

The invention will be described with reference to the accompanying drawings, wherein like numbers reference like elements.

In the drawings, the film thicknesses, the proportion of dimensions, etc., of each structure are suitably changed for ease of recognition in the drawings.

DESCRIPTION OF EXEMPLARY EMBODIMENTS

First Embodiment

Figure 1:
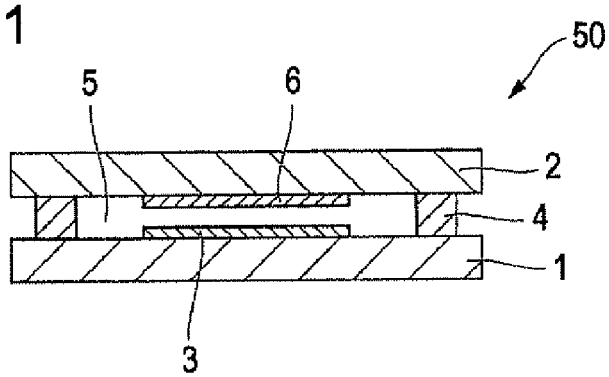
FIG. 1 is a cross-sectional view showing the structure of an organic EL device according to a first embodiment of the invention.
Figure 2:
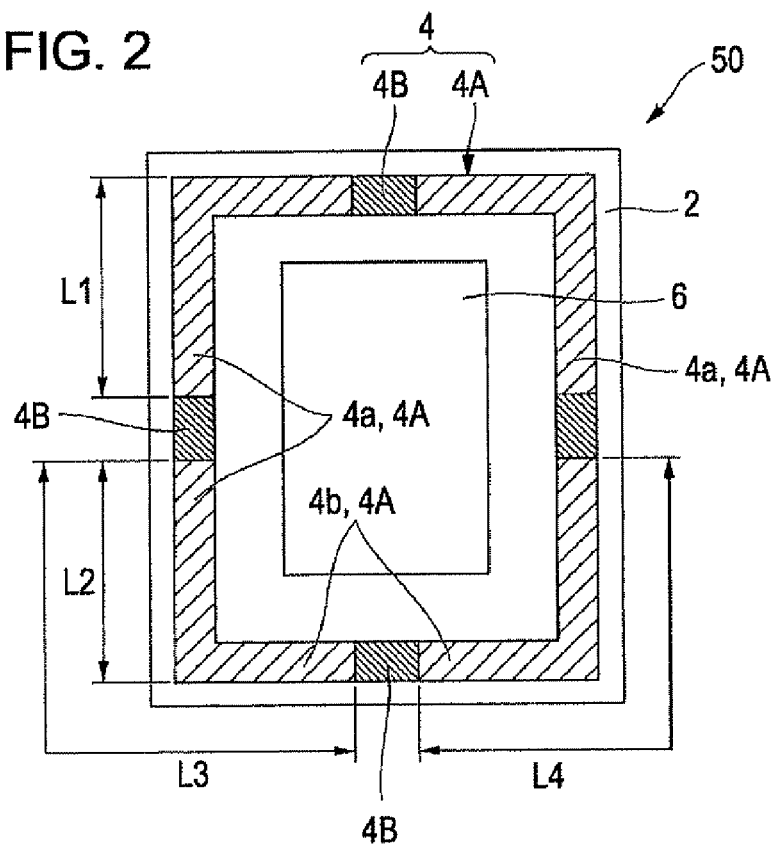
FIG. 2 is a plan view showing the structure of a sealing portion of the organic EL device according to the first embodiment of the invention.
Figure 3:
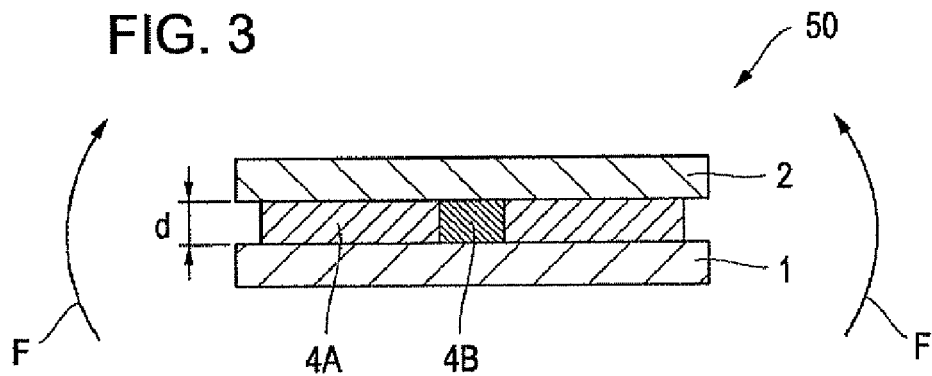
FIG. 3 is a side view showing the organic EL device according to the first embodiment of the invention.

FIG. 1 is a cross-sectional view showing the structure of an organic EL device according to a first embodiment of the invention. FIG. 2 is a plan view showing the structure of a sealing portion of the organic EL device according to the first embodiment of the invention. FIG. 3 is a side view showing the organic EL device according to the first embodiment of the invention.

As shown in FIG. 1, an organic EL device 50 according to the first embodiment contains an element substrate 1, a sealing substrate 2, a light emitting unit 3, a sealing portion 4, and a desiccant 6.

The element substrate 1 and the sealing substrate 2 are each composed of a glass substrate, for example. As either one of the element substrate 1 and the sealing substrate 2, a metal substrate may be used when light from the light emitting unit 3 is not required to be transmitted therethrough.

The light emitting unit 3 is formed on the element substrate 1. The light emitting unit 3 contains an organic EL element as a light emitting element, a pixel electrode and a cathode for holding the organic EL element therebetween, and a switching circuit, such as a TFT (Thin Film Transistor). Such a light emitting unit contains a plurality of pixels arranged in a matrix and makes the light emitting element emit light from every pixel by driving the TFT.

The desiccant 6 is a sheet shaped desiccant, and is provided on the sealing substrate 2 in such a manner as to face the light emitting unit 3. As shown in FIG. 2, the desiccant 6 is disposed at the center of the sealing substrate 2. Both the substrates 1 and 2 are sealed by the sealing portion 4 in the state where the light emitting unit 3 and the desiccant 6 are disposed between the element substrate 1 and the sealing substrate 2. More specifically, the organic EL device 50 has a structure in which the light emitting unit 3 is sealed by the sealing portion 4 between a pair of the element substrate 1 and the sealing substrate 2. By disposing the light emitting unit 3 and the desiccant 6 in a sealed space 5, the light emitting unit 3 is disposed in a dry state. In this embodiment, the desiccant 6 is disposed at the center of the sealing substrate 2, and the desiccant 6 may be disposed in the space 5.

As shown in the plan view of FIG. 2, the sealing portion 4 is provided around the desiccant 6, and contains sealing glass portions 4A and sealing resin portions 4B.

The sealing glass portions 4A are formed by curing glass frit containing a powder glass material as a main component. The sealing glass portions 4A have an advantage of excellent sealing properties against moisture or oxygen.

The sealing resin portions 4B are formed of an epoxy resin adhesive. Due to the flexibility thereof, an external stress applied to the substrates is reduced, and thus the sealing resin portions 4B have an advantage of excellent resistance against an external stress. The sealing resin portions 4B may be formed of an acrylic adhesive or a silicon adhesive.

The sealing glass portions 4A have a vertical linear portion 4a and a horizontal linear portion 4b. The sealing glass portions 4A are formed into an L shape in which the vertical linear portion 4a and the horizontal linear portion 4b are integrally formed in a state where the vertical linear portion 4a and the horizontal linear portion 4b are connected to each other at an angle of 90°. Thus, the sealing glass portions 4A are not formed into an annular shape, and have end portions. The sealing glass portion 4A is connected to the sealing resin portions 4B at the end portions. In this embodiment, the number of the sealing glass portions 4A formed on the sealing substrate 2 is four.

The sealing resin portions 4B are disposed at both ends of the sealing glass portion 4A, and the number of the sealing resin portions 4B formed on the sealing substrate 2 is four. The sealing resin portions 4B are not formed into an annular shape, and have end portions. The sealing resin portions 4B are connected to the sealing glass portions 4A at the ends.

Thus, the four sealing glass portions 4A and the four sealing resin portions 4B are connected to form an annular shape, thereby forming the sealing portion 4 having a rectangular shape.

In the sealing portion 4 formed into a rectangular shaper the sealing resin portions 4B are formed at each of two sides facing each other. In other words, the sealing resin portions 4B are provided to each side of the sealing portion 4.

One side extending in the longitudinal direction in the sealing portion 4 is formed by connection of two vertical linear portions 4a of the sealing glass portion and the sealing resin portions 43. The length L1 and the length L2 of the two vertical linear portions 4a forming one vertical side are equal to each other (L1=L2).

One side extending in the transverse direction in the sealing portion 4 is formed by connection of two horizontal linear portions 4b of the sealing glass portion and the sealing resin portion 4B. The two horizontal linear portions 4b forming one horizontal side are equal in length similarly as above.

Furthermore, the four sealing glass portions 4A are equal in length (total length of the vertical linear portion 4a and the length of the horizontal linear portion 4b). More specifically, the length L3 and the length L4 shown in FIG. 2 are equal to each other (L3=L4).

Thus, the respective sealing glass portions 4A disposed at both sides of the sealing resin portions 4B have the same length, and are uniformly disposed on the sealing substrate 2.

When the total length of the four sealing glass portions 4A is compared with the total length of the four sealing resin portions 4B among the lengths of the respective portions of the sealing portion 4 forming a rectangular shape, the total length of the sealing resin portions 4B is smaller than the total length of the sealing glass portions 4A. This is because the length of the sealing glass portion 4A is increased in order to increase the sealing properties against moisture or oxygen. The length of the sealing resin portion 4B may be small insofar as an external stress applied to the organic EL device 50 can be reduced. A ratio between the length of the total length of the sealing glass portions 4A and the total length of the sealing resin portions 4B is suitably determined in view of the sealing properties against moisture or oxygen and an external stress applied to the organic EL device 50.

In this embodiment, as shown in FIG. 2, the sealing resin portions 4B are formed at the center of each of the four sides of the sealing portion 4. As described later, the position and the number of the sealing resin portions 4B to be formed at one side are suitably determined in accordance with various shapes of substrates (element substrate 1 and sealing substrate 2), e.g., the case where the substrate has a long rectangular shape or the case where the substrate has a substantially square shape. Specifically, the position and the number of the sealing resin portions 4B to be formed at one side are suitably determined in view of the sealing properties against moisture or oxygen and an external stress to be applied to the organic EL device 50.

As shown in the side view of FIG. 3, the sealing glass portion 4A and the sealing resin portion 4B are held between the element substrate 1 and the sealing substrate 2. The sealing resin portions 4B are provided between the two sealing glass portions 4A. As described later, the sealing resin portion 4B is formed by supplying a resin adhesive from the side surface of the organic EL device 50 and curing the same in the state where the sealing glass portions 4A are held between the element substrate 1 and the sealing substrate 2.

An interval (gap) d between the element substrate 1 and the sealing substrate 2 is set to, for example, 10 μm to 20 μm.

In the organic EL device 50 thus structured, when an external stress is applied as shown by the reference character F of FIG. 3, i.e., an external stress is applied in the direction of bending the organic EL device 50, a stress is applied to the element substrate 1, the sealing substrate 2, and the sealing portion 4. In particular, since the cross sectional area of the sealing portion 4 is smaller than that of each of the element substrate 1 and the sealing substrate 2, a stress is concentrated on the sealing portion 4. As described above, since the sealing portion 4 contains the sealing glass portions 4A and the sealing resin portions 4B, the external stress F is reduced by the sealing resin portions 4B. Therefore, the sealing glass portions 4A are free from cracks or separation. Thus, high sealing properties are maintained by the sealing glass portions 4A.

As described above, in the organic EL device 50 of this embodiment, high sealing properties can be obtained and excellent resistance against an external stress can be obtained. More specifically, effects of obtaining high sealing properties compared with those obtained by a sealing structure containing a resin adhesive alone and obtaining high resistance against an external stress compared with that obtained by a sealing structure containing a glass material alone are obtained.

Therefore, the organic EL device 50 is achieved in which deterioration of an element, reduction in brightness, and shortening of emission life resulting from contact of the light emitting unit with moisture or oxygen in the air are suppressed and resistance against an external stress is obtained.

In this embodiment, the sealing resin portions 4B are provided to the center of each side of the rectangular shaped sealing portion 4 and the sealing glass portions 4A disposed at both sides of the sealing resin portions 4B are equal in length. Therefore, an external stress generated in the sealing glass portions 4A becomes equal and an external stress to be applied to the rectangular shaped sealing portion 4 can be uniformly distributed.

Since the light emitting unit 3 and the desiccant 6 are disposed in a space 5 surrounded by the element substrate 1, the sealing substrate 2, and the sealing portion 4, the inside of the space 5 can be maintained in a dry state, and deterioration of the light emitting unit 3 due to moisture or oxygen can be prevented.

In this embodiment, a structure in which one sealing resin portion 4B is provided to each side of the rectangular shaped sealing portion 4 is described. However, this embodiment is not limited to this structure, a structure in which a plurality of sealing resin portions 4B are provided to each side of the sealing portion 4 may be employed.

Modified Example of First Embodiment

Figure 4:
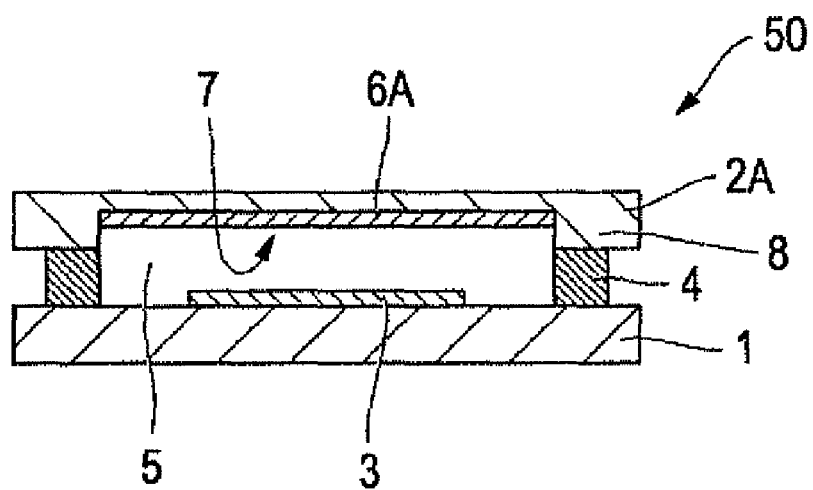
FIG. 4 is a cross-sectional view showing a modified example of the organic EL device according to the first embodiment of the invention.

FIG. 4 is a cross-sectional view showing a modified example of the organic EL device 50 according to the first embodiment of the invention.

As shown in FIG. 4, the sealing substrate 2A has a concave portion 7 and a convex portion 8. The thickness of the sealing substrate 2A in the concave portion 7 is thinner than the thickness of the sealing substrate 2A in the convex portion 8. The desiccant 6A obtained by curing a liquid dry material is provided to the concave portion 7. The sealing portion 4 is held between the convex portion 8 and the element substrate 1.

Here, a process of providing the desiccant 6A inside the concave portion 7 will be described.

First, the concave portion 7 is formed at the center of the sealing substrate 2A. Thereafter, a liquid dry material is disposed in the concave portion. Thereafter, by curing the dry material, the desiccant 6A is formed in the concave portion 7.

As described above, since the sealing portion 4 is held between the convex portion 8 of the sealing substrate 2 and the element substrate 1 in this modification even when the desiccant 6A formed using a liquid dry material is disposed, the same effects as those of the first embodiment are obtained.

Second Embodiment

Figure 5:
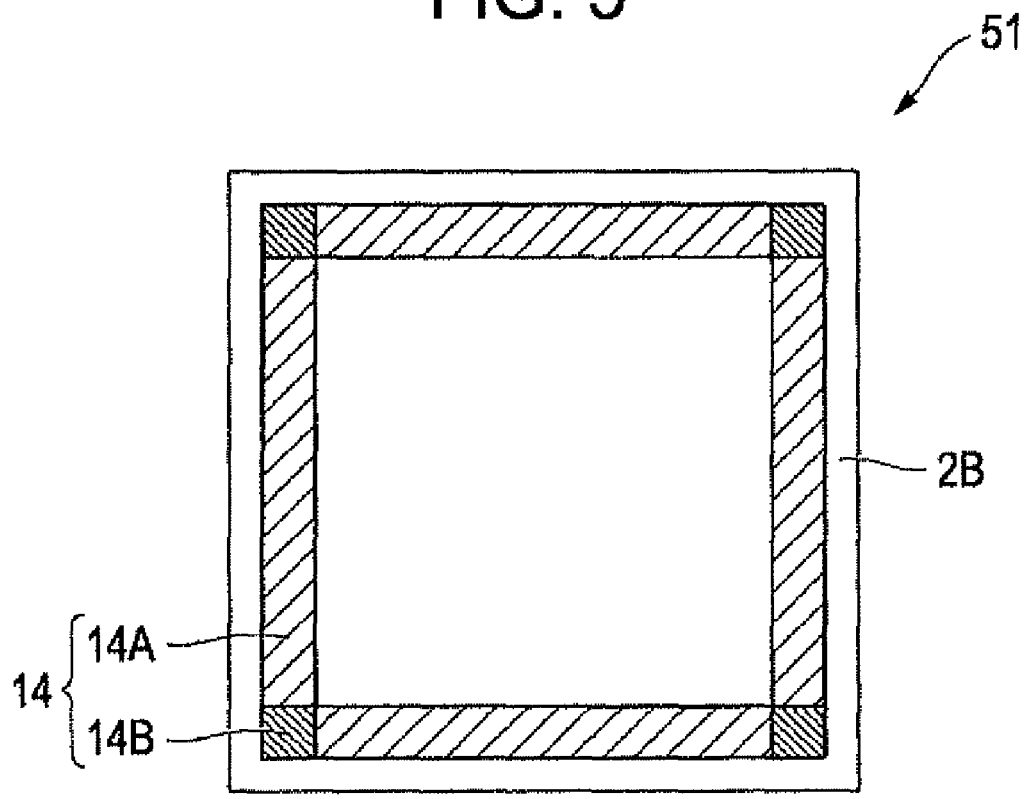
FIG. 5 is a plan view showing the structure of a sealing portion of an organic EL device according to a second embodiment of the invention.

FIG. 5 is a plan view showing the structure of a sealing portion 14 of an organic EL device 51 according to a second embodiment of the invention containing a sealing substrate 2B and a sealing portion 14. The same components as those of the first embodiment are designated with the same reference numerals, and thus the descriptions thereof are omitted.

As shown in FIG. 5, the sealing portion 14 having a rectangular shape has linear sealing glass portions 14A disposed on four sides of the rectangular shape and sealing resin portions 14B disposed at four corners of the rectangular shape.

In the first embodiment described above, the sealing glass 4A formed into an L shape is used. In this case, when an external stress is applied to the organic EL device, a stress is concentrated on a bending portion in the L shape.

In contrast, in this embodiment, sealing resins 14B are provided to the four corners of the rectangular shaped sealing portion 14. Therefore, an effect of reducing an external stress which is easily concentrated on the four corners can be obtained Moreover, an external stress generated in the diagonal direction of the sealing portion 14 formed into a rectangular shape can be reduced.

In this embodiment, the linear sealing glass portion 14A alone is disposed at each of the four sides of the rectangular shape, but the sealing resin portion 14B of the second embodiment may be provided to each of the four sides of the rectangular shape.

Third Embodiment

Figure 6:
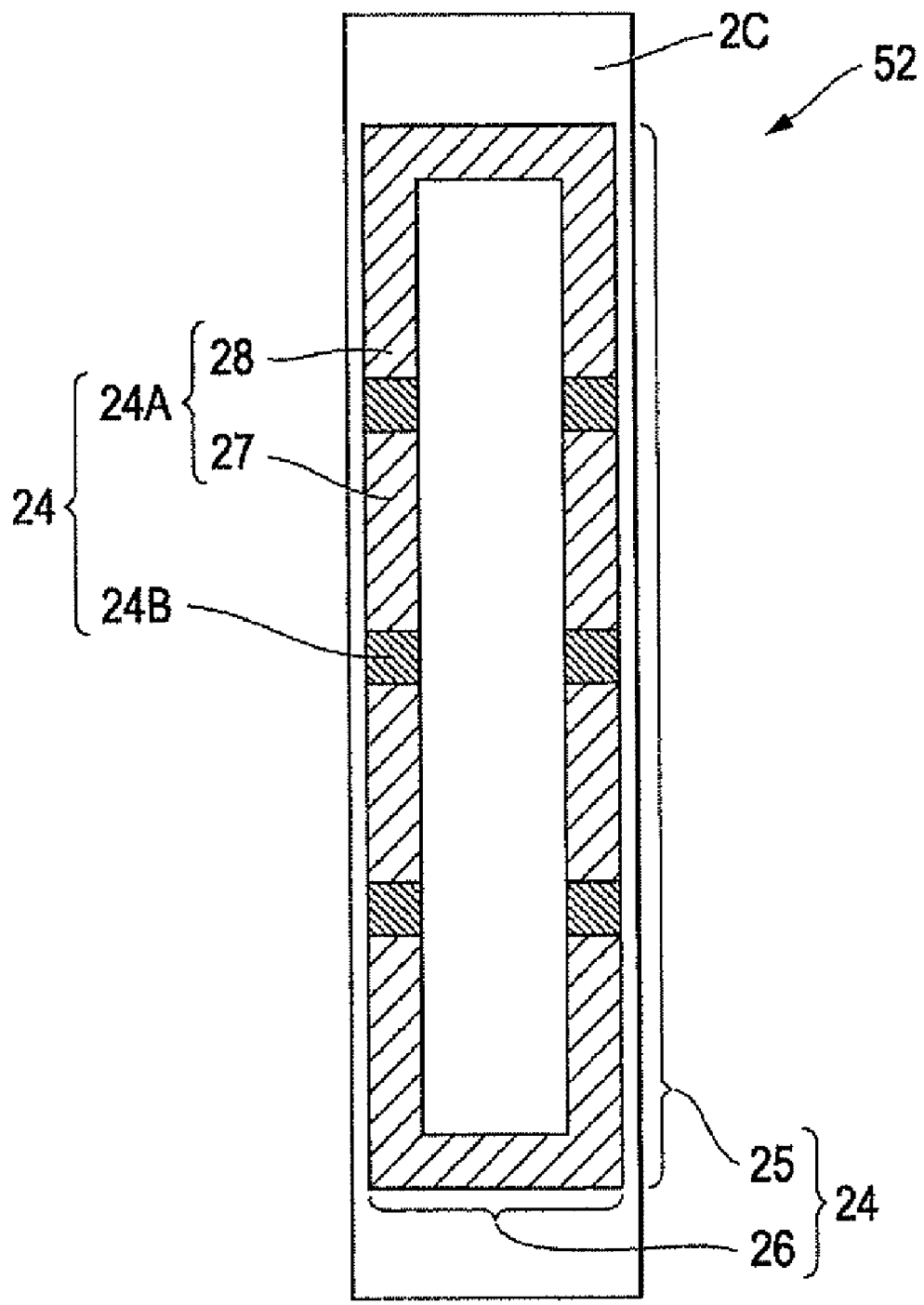
FIG. 6 is a plan view showing the structure of a sealing portion of an organic EL device according to a third embodiment of the invention.

FIG. 6 is a plan view showing the structure of a sealing portion 24 of an organic EL device 52 according to a third embodiment of the invention. The same components as those of the first embodiment are designated with the same reference numerals, and thus the descriptions thereof are omitted.

As shown in FIG. 6, unlike the shapes of the sealing substrates shown in FIGS. 2 and 5, the shape of the sealing substrate 2C is a long and narrow rectangular shape. In the sealing substrate 2C of this embodiment, the length in the longitudinal direction (the length of a long side) is 330 mm, for example, and the length in the transverse direction (the length of a short side) is 10 to 20 mm, for example. In the organic EL device 52 of this embodiment, the element substrate having the same shape as that of the sealing substrate 2C and the sealing substrate 2C are sealed by the sealing portion 24.

The sealing portion 24 is formed into a rectangular shape and has long sides 25 provided along the long side of the sealing substrate 2C and facing each other and short sides 26 provided along the short side of the sealing substrate 2C and facing each other. Such a sealing portion 24 contains the sealing glass portions 24A and the sealing resin portions 24B similarly as in the above-described embodiments. As a structure different from those of the above-described embodiments, the sealing glass portions 24A contain the linear portion 27 linearly formed along the extending direction of the long side 25 and a bending portion 28 formed into a substantially U shape (squared U-shape) including the short side 26.

The shape of the bending portion 28 will be specifically described. The bending portion 28 is located at the ends of each of the long sides 25 and contains two parallel vertical linear portions extending in the extending direction of the long side 25 and a horizontal linear portion connected to one end of each of the two vertical linear portions and intersecting at right angles with the vertical linear portions.

At each of the long sides 25, the linear portions 27 of the sealing glass portions 24A and the sealing resin portions 24B are provided. At the end portion of each of the long sides 25, the vertical linear portion of the bending portion 28 is located.

At each of the short sides 26, the sealing resin portion 24B is not provided, and the horizontal linear portion of the bending portion 28 is located.

In the case where the length of the long side of the substrate of the organic EL device 52 is about 10 times longer than the length of the short side as in this embodiment, when an external stress is applied to the organic EL device 52, the long side easily bends and the short side becomes difficult to bend.

Thus, in the organic EL device 52 in which the lengths of the long side and the short side are significantly different from each other, a stress is easily generated in the sealing portion extending in the direction of the long side and a stress is hardly generated in the sealing portion extending in the direction of the short side.

Then, in this embodiment, the sealing resin portions 24B are disposed at the long sides 25 of the sealing portion 24 and the sealing resin portions 24B are not disposed at the short sides 26 of the sealing portion 24 in which a stress is hard to generate. At the short sides 26, the bending portions 28 of the sealing glass portions 24A are provided.

Thus, an external stress generated in each of the long sides 25 can be reduced by the sealing resin portions 24B. Moreover, the sealing properties of the short sides 26 can be increased by the bending portions 28 of the sealing glass portions 24A.

Fourth Embodiment

FIGS. 7 to 10 are views showing a method for producing an organic EL device according to a fourth embodiment of the invention. FIG. 7A shows a plan view of an element substrate, and FIG. 8A, FIG. 9A, and FIG. 10A show plan views of a sealing substrate. FIG. 7B is a cross-sectional view of the sealing substrate. FIGS. 8B and 9B are cross-sectional views of the sealing substrate. FIG. 10B is a side view of the sealing substrate.

In the fourth embodiment, the same components as those of the first to the third embodiments are designated with the same reference numerals, and thus the descriptions thereof are omitted.

FIGS. 7 to 10 show a method for producing the organic EL device 50 of the first embodiment. However, the organic EL device 51 of the second embodiment and the organic EL device 52 of the third embodiment can be produced in the same method.

Figure 7A:
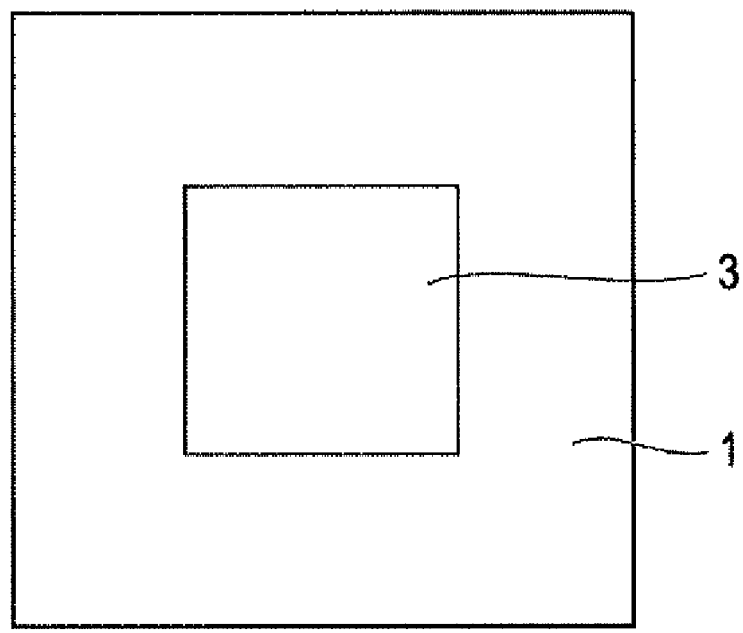
FIG. 7A is a view showing a method for producing an organic EL device according to a fourth embodiment of the invention.
Figure 7B:
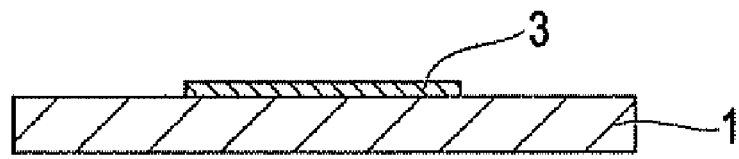
FIG. 7B is a view showing a method for producing an organic EL device according to a fourth embodiment of the invention.

First, as shown in FIGS. 7A and 7B, the light emitting unit 3 is provided substantially to the center of the element substrate 1. The surface of the element substrate 1 is exposed around the periphery of the light emitting unit 3, i.e., the periphery of the element substrate 1. The exposure area is an area where the element substrate 1 and the sealing substrate are bonded to each other to form the sealing portion 4.

Figure 8A:
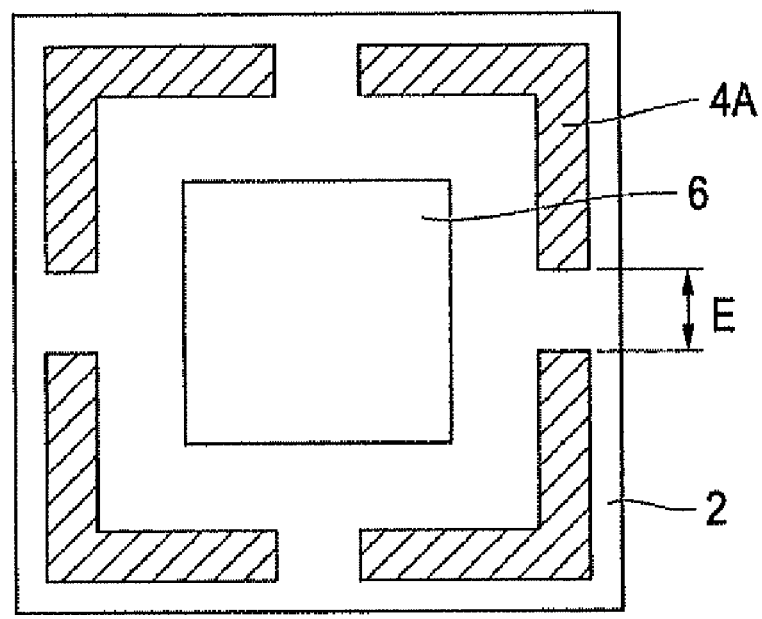
FIG. 8A is a view showing the method for producing an organic EL device according to the fourth embodiment of the invention.
Figure 8B:
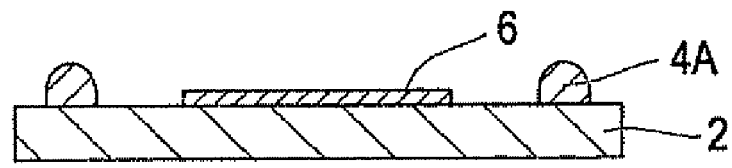
FIG. 8B is a view showing the method for producing an organic EL device according to the fourth embodiment of the invention.

Next, as shown in FIGS. 8A and 8B, the desiccant 6 is formed substantially at the center of the sealing substrate 2. Moreover, around the periphery of the desiccant 6, i.e., the periphery of the sealing substrate 2, glass resin materials (liquid glass) containing a glass material are disposed. The glass resin materials are disposed at a given interval E on the sealing substrate 2. The lengths of the glass resin materials are adjusted so that the lengths of the adjacent glass resin materials are equal in length. The glass resin material is a paste containing glass frit and a resin material. As a method for disposing the glass resin materials, a method is employed which involves discharging a glass resin material from a dispenser, and applying a glass resin material onto the sealing substrate 2. A printing method may be used besides the application method.

After the glass resin material is disposed on the sealing substrate 2, the glass resin material is heated to 300° C. to 400° C. for calcination. Thus, by calcinating the glass resin material, the resin material contained in the glass resin material is removed, thereby forming the sealing glass portions 4A containing glass frit on the sealing substrate 2.

The sealing glass portions 4A are colored. For example, the sealing glass portions 4A may be colored by blending a coloring material or the like in the glass resin material, and leaving the coloring material in the sealing glass portions 4A or the material itself of the sealing glass portions 4A may be colored.

The sealing glass portion 4A is a glass material containing a transition metal, and, as the composition thereof, $B_2O_3$—ZnO, $B_2O_3$—PbO, PbO—ZnO—$B_2O_3$, ZnO—$B_2O_3$—$SiO_2$, etc., are mentioned.

Figure 9A:
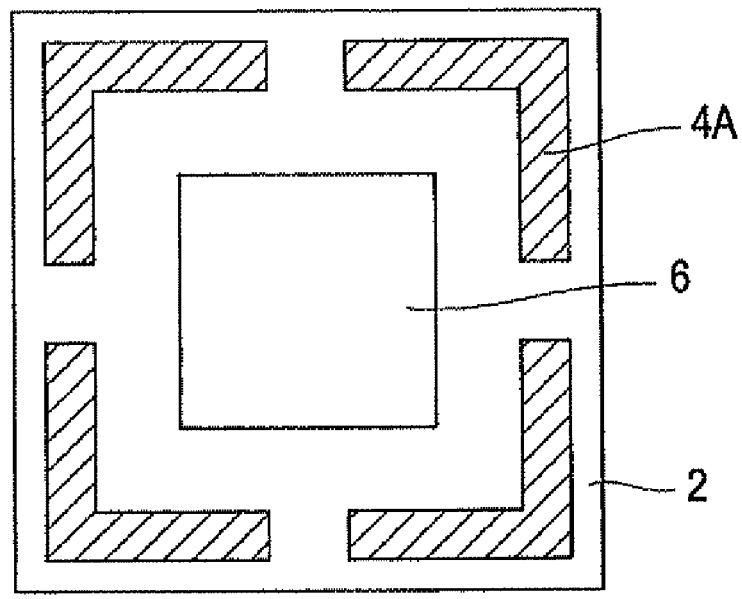
FIG. 9A is a view showing the method for producing an organic EL device according to the fourth embodiment of the invention.
Figure 9B:
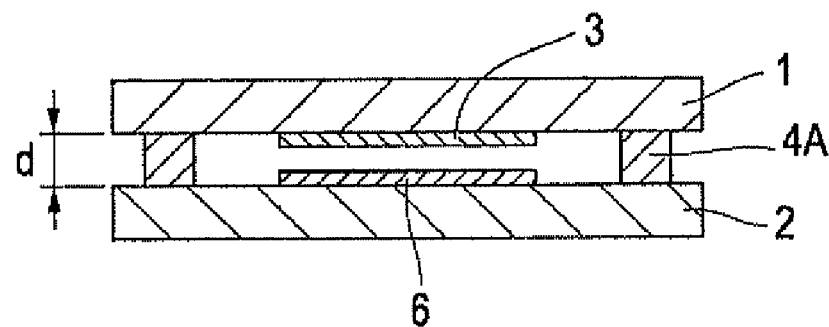
FIG. 9B is a view showing the method for producing an organic EL device according to the fourth embodiment of the invention.

Next, as shown in FIGS. 9A and 9B, the element substrate 1 and the sealing substrate 2 are bonded to each other so that the light emitting unit 3 is disposed therebetween, i.e., so that the light emitting unit 3 and the desiccant 6 are faced with each other.

Next, the sealing glass portions 4A are irradiated with laser light from the outside of either one of the element substrate 1 and the sealing substrate 2. The laser light transmits through the substrate from the outside of the substrate to reach the sealing glass portions 4A held between the element substrate 1 and the sealing substrate 2, whereby the light energy of the laser light is transmitted to the sealing glass portions 4A. The sealing glass portions 4A melt by absorbing the light energy of the laser light. The molten sealing glass portions 4A melt-bond the element substrate 1 and the sealing substrate 2.

Since the sealing glass portions 4A are colored as described above, the energy of the laser light is transmitted to the sealing glass portions 4A without the laser light transmitting through the sealing glass portions 4A. Since the sealing glass portions 4A contain a transition metal in a high proportion, the melting point becomes low and melts at a low temperature as compared with the case where a transition metal is not contained. Therefore, the sealing glass portions 4A can be efficiently melted in a short time with a small amount of laser light.

Thus, the element substrate 1 and the sealing substrate 2 are bonded to each other through the sealing glass portions 4A, whereby the element substrate 1 and the sealing substrate 2 are separated at a given interval d.

Figure 10A:
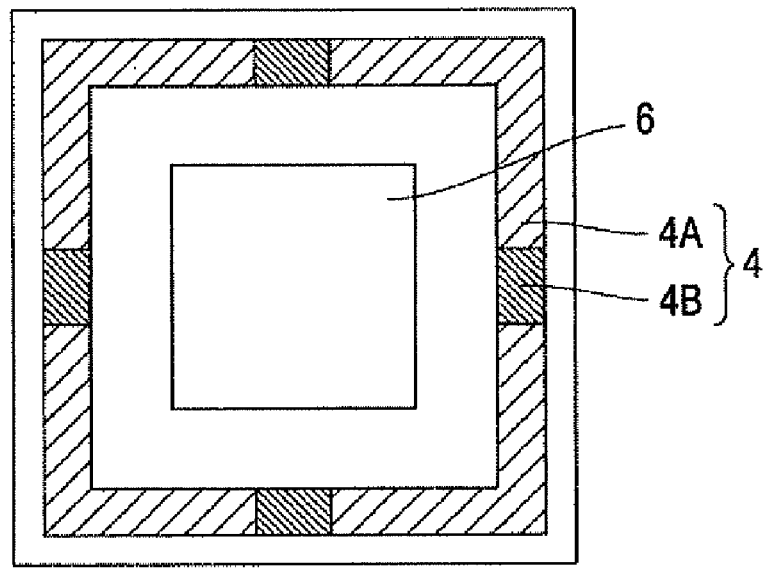
FIG. 10A is a view showing the method for producing an organic EL device according to the fourth embodiment of the invention.
Figure 10B:
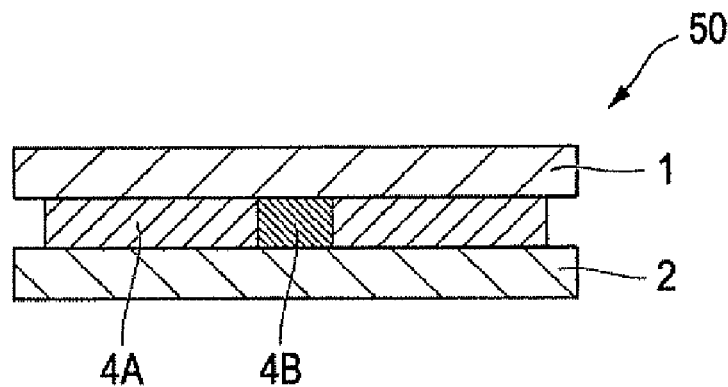
FIG. 10B is a view showing the method for producing an organic EL device according to the fourth embodiment of the invention.

Next, as shown in FIGS. 10A and 10B, the sealing resin portions 4B are formed between the sealing glass portions 4A which are adjacent to each other in the state where the element substrate 1 and the sealing substrate 2 are bonded to each other.

A process of forming the sealing resin portion 4B includes a process of disposing a liquid resin adhesive and a process of curing the resin adhesive.

Specifically, a liquid resin adhesive is disposed between the sealing glass portions 4A which are adjacent to each other between the element substrate 1 and the sealing substrate 2. Specifically, the resin adhesive is disposed using a dispenser or a micropipet between the element substrate 1, the sealing substrate 2, and the sealing glass portions 4A. In the process, the resin adhesive flows toward the gap between these components due to the action of the surface tension of the components (element substrate 1, sealing substrate 2, and sealing glass portion 4A) in contact with the resin adhesive. Then, the resin adhesive stays in a gap E between the sealing glass portions 4A. Next, the resin adhesive staying between the sealing glass portions 4A is cured to form the sealing resin portions 4B.

As a specific material of the resin adhesive, an epoxy resin adhesive is employed. The sealing resin portions 4B may be formed of an acrylic adhesive or a silicon adhesive.

When the resin adhesive is an ultraviolet curing resin, a method involving irradiating the resin adhesive with ultraviolet light for curing the resin adhesive is employed. When the resin adhesive is a thermosetting resin, a method involving curing the resin adhesive by heating is employed. The resin adhesive may be cured by heating after irradiated with ultraviolet light, the resin adhesive.

In such a process of forming the sealing resin portion 4B, a liquid resin adhesive can be certainly disposed between the sealing glass portions 4A utilizing the surface tension, and the sealing resin portions 4B can be formed by curing the resin adhesive.

As described above, the above-described organic EL device 50 in which the sealing portion 4 containing the sealing glass portions 4A and the sealing resin portions 4B is formed into a rectangular shape, and the light emitting unit 3 is sealed between the element substrate 1 and the sealing substrate 2 can be produced through the processes.

Therefore, in this embodiment, an organic EL device can be obtained in which high sealing properties can be obtained and excellent resistance against an external stress is obtained. More specifically, the effects of obtaining high sealing properties compared with the sealing structure containing a resin adhesive alone and obtaining high resistance against an external stress compared with the sealing structure containing the glass material alone are obtained.

Therefore, the organic EL device 50 is achieved in which deterioration of an element, reduction in brightness, and shortening of emission life resulting from the contact of the light emitting unit with moisture or oxygen in the air are suppressed and resistance against an external stress is obtained.

Fifth Embodiment

Next, the structure of the light emitting unit 3 in the above organic EL device 50 will be described as a fifth embodiment of the invention.

Figure 11:
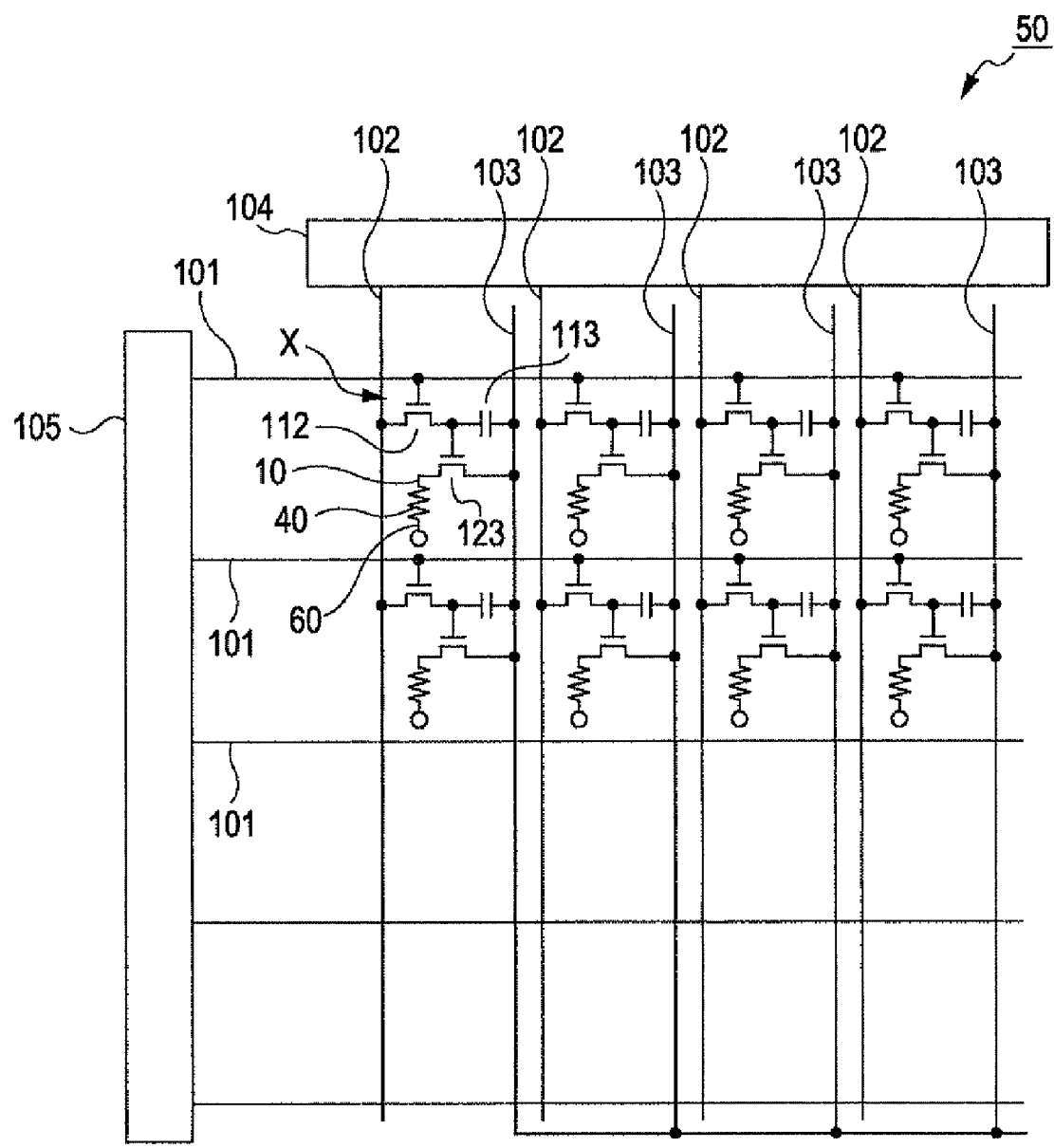
FIG. 11 is a view schematically showing a wiring structure of an organic EL device according to a fifth embodiment of the invention.
Figure 12:
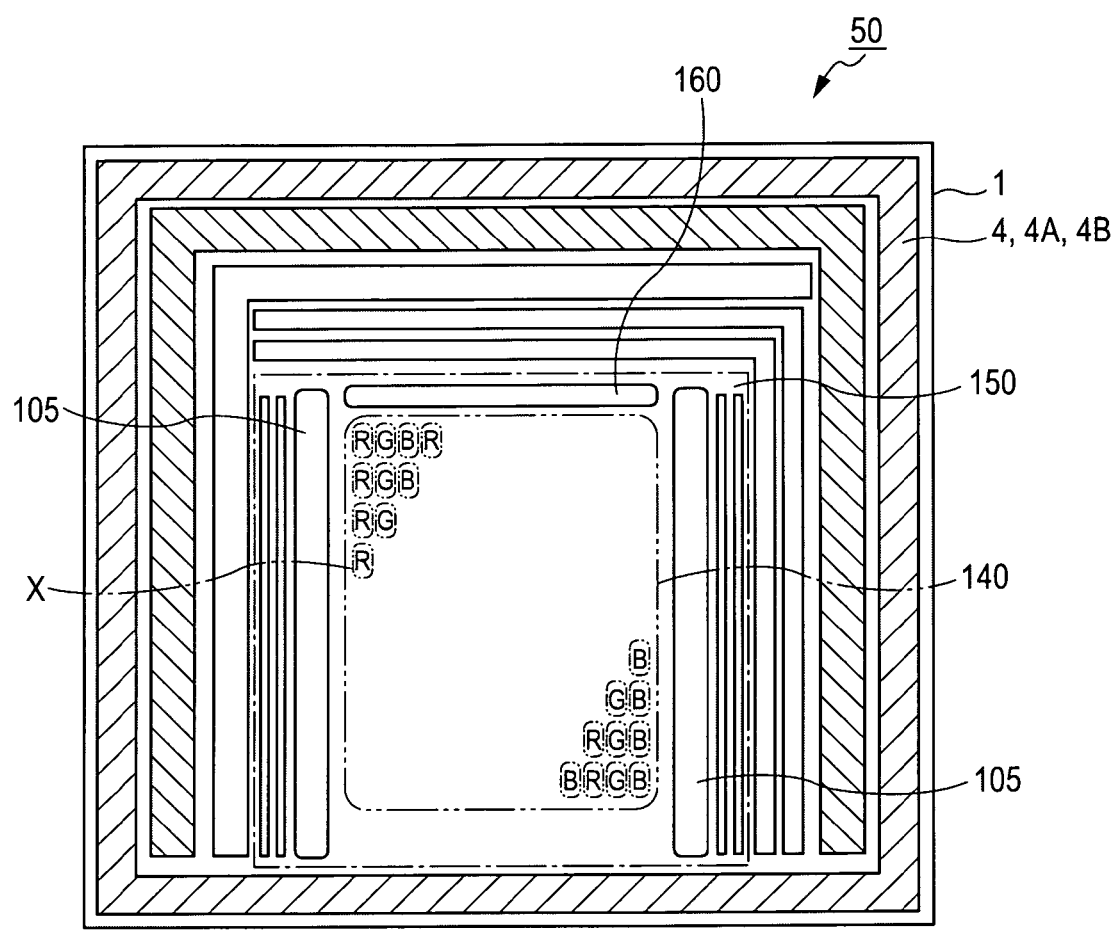
FIG. 12 is a plan view schematically showing the structure of the organic EL device according to the fifth embodiment of the invention.

FIG. 11 is a view schematically showing the wiring structure of the organic EL device according to the fifth embodiment of the invention. FIG. 12 is a plan view schematically showing the structure of the organic EL device according to the fifth embodiment of the invention.

The same components as those of the first embodiment are designated with the same reference numerals, and thus the descriptions thereof are omitted.

FIG. 11 is a view schematically showing the wiring structure of the organic EL device 50 according to the first embodiment of the invention. The organic EL device 50 is an active matrix type organic EL device using a TFT as a switching element. The organic EL device 50 has a wiring structure containing a plurality of scanning lines 101, a plurality of signal lines 102 extending in the direction orthogonal to the each scanning line 101, and a plurality of source lines 103 extending in parallel to each signal line 102. In the organic EL device 50, sub pixels X are formed near each crossing point between the scanning lines 101 and the signal lines 102.

To the signal line 102, a data line driving circuit 104 provided with a shift register, a level shifter, a video line, and an analog switch is connected. Moreover, to the scanning line 101, a scanning line driving circuit 105 provided with a shift register and a level shifter is connected.

Furthermore, each sub pixel X has a switching TFT 112 in which a gate electrode is supplied with a scanning signal via the scanning line 101, a storage capacitor 113 for storing a pixel signal supplied from the signal line 102 via the switching TFT 112, a driving TFT 123 in which the gate electrode is supplied with the pixel signal stored in the storage capacitor 113, an anode (pixel electrode) 10 into which a driving current flows from the power line 103 when electrically connected to the power line 103 via the driving TFT 123, and a light emitting element 40 interposed between the pixel electrode 10 and a common electrode 60.

According to the organic EL device 50, when the scanning line 101 is driven to turn on the switching TFT 112, the potential of the signal line 102 at that time is stored in the storage capacitor 113. Depending on a state of the storage capacitance 113, an on or off state of the driving TFT 123 is determined. Then, a current flows from the power line 103 into the pixel electrode 10 via a channel of the driving TFT 123, and the current flows into the common electrode 60 via the light emitting element 40. Then, the light emitting unit 40 emits light depending on the amount of current flowing therethrough.

As shown in FIG. 12, the organic EL device 50 contains the element substrate having light transmittance and electrical insulation and the light emitting unit 3 (pixel portion, within a dashed line box in FIG. 12) which is positioned substantially at the center of the element substrate 1 and has substantially a rectangular shape in plan view. The light emitting unit 3 is divided into an actual display region 140 (in FIG. 12, within a chain double-dashed line box) in which the sub pixels X are disposed in a matrix and a dummy region 150 (a region between the dashed line and the chain double-dashed line) disposed in the vicinity of the actual display region 140.

The light emitting element 40 of each sub pixel X can extract light of either one of red (R), green (G), or blue (B) by emitting light. As the light of each color, the light emitting element 40 may directly emit light of each color or white light emitted from the light emitting element 40 may be modulated to light of each color through a color filter corresponding to R, G, and B. In the actual display area 140, the sub pixels X of the same color are arranged in the longitudinal direction of FIG. 12 to form a so-called stripe arrangement. In the actual pixel area 140, a full color display can be performed by mixing RGB lights emitted from the sub pixels X disposed in a matrix.

The scanning line driving circuit 105 is disposed at both sides of the actual display area 140 in FIG. 12. The scanning line driving circuit 105 is disposed on the lower layer side a dummy region 150. On an upper side of the actual display region 140 in FIG. 12, a test circuit 160 is disposed, and the test circuit 160 is provided on the lower layer side of the dummy region 150. The test circuit 160 is a circuit to test operating conditions of the organic EL device 50. For example, the test circuit 160 has a test information output device (not shown) that outputs test results to the outside. The test circuit 160 is structured in such a manner as to test the quality and defects of a display device during manufacture or at the time of shipment.

As shown in FIG. 12, the sealing portion 4 having a rectangular shape is disposed around the periphery of the element substrate 1. As shown in FIG. 1, the sealing portion 4 is held between the sealing substrate 2 and the element substrate 1 and prevents moisture or oxygen from entering the inside of the organic EL device 50. The sealing portion 4 contains the sealing glass portions 4A and the sealing resin portions 4B. Therefore, in the organic EL device 50, high sealing properties are obtained and excellent resistance against an external stress is obtained.

In this embodiment, the sealing portion 4 shown in FIG. 1 is used, but the sealing portion 14 shown in FIG. 5 may be used.

Sixth Embodiment

Next, an embodiment in which the organic EL device according to an aspect of the invention is used for a line head will be described as the sixth embodiment.

Figure 13:
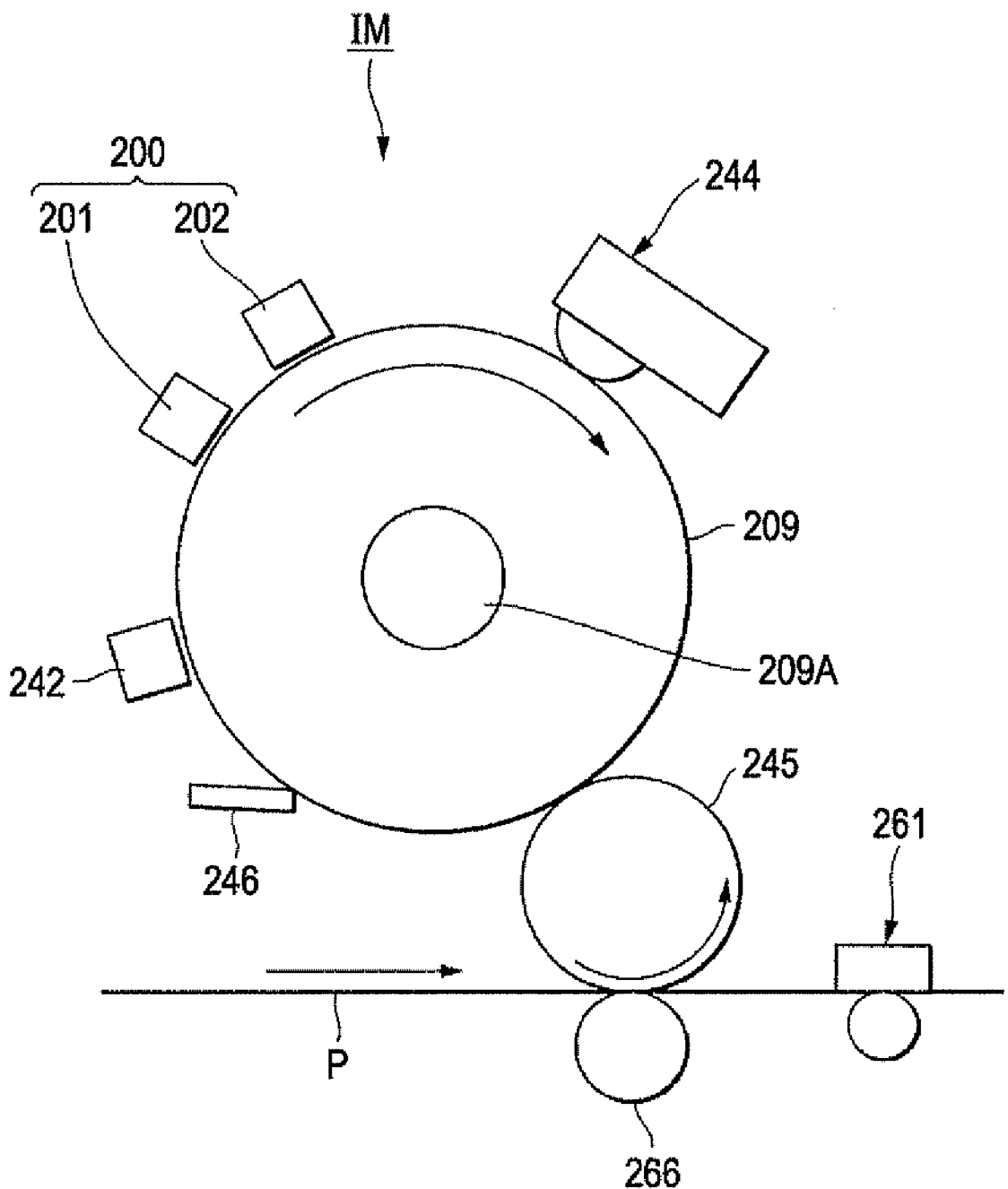
FIG. 13 is a view showing the outline structure of an image forming device having a line head according to a sixth embodiment of the invention.
Figure 14:
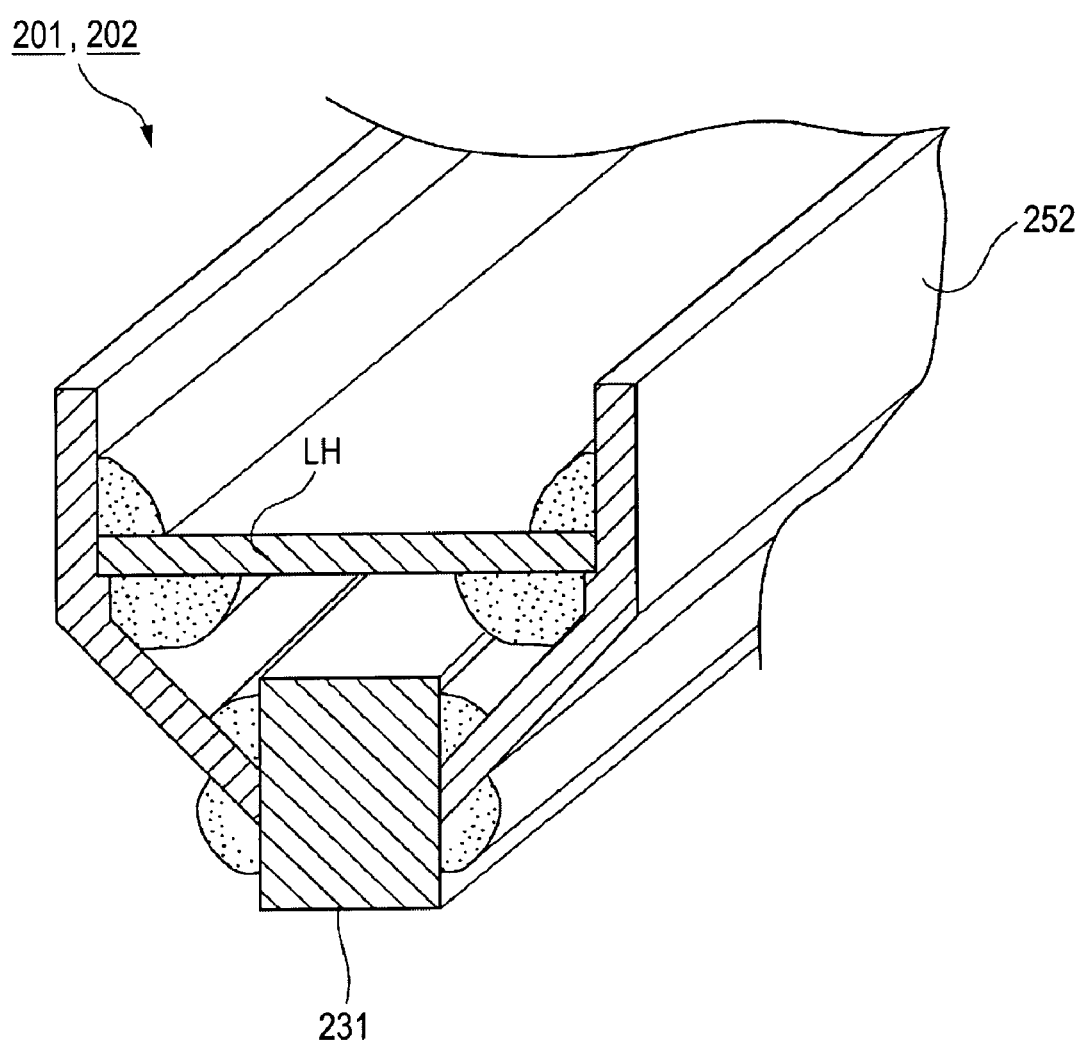
FIG. 14 is a perspective cross-sectional view of a head module according to the sixth embodiment of the invention.
Figure 15:
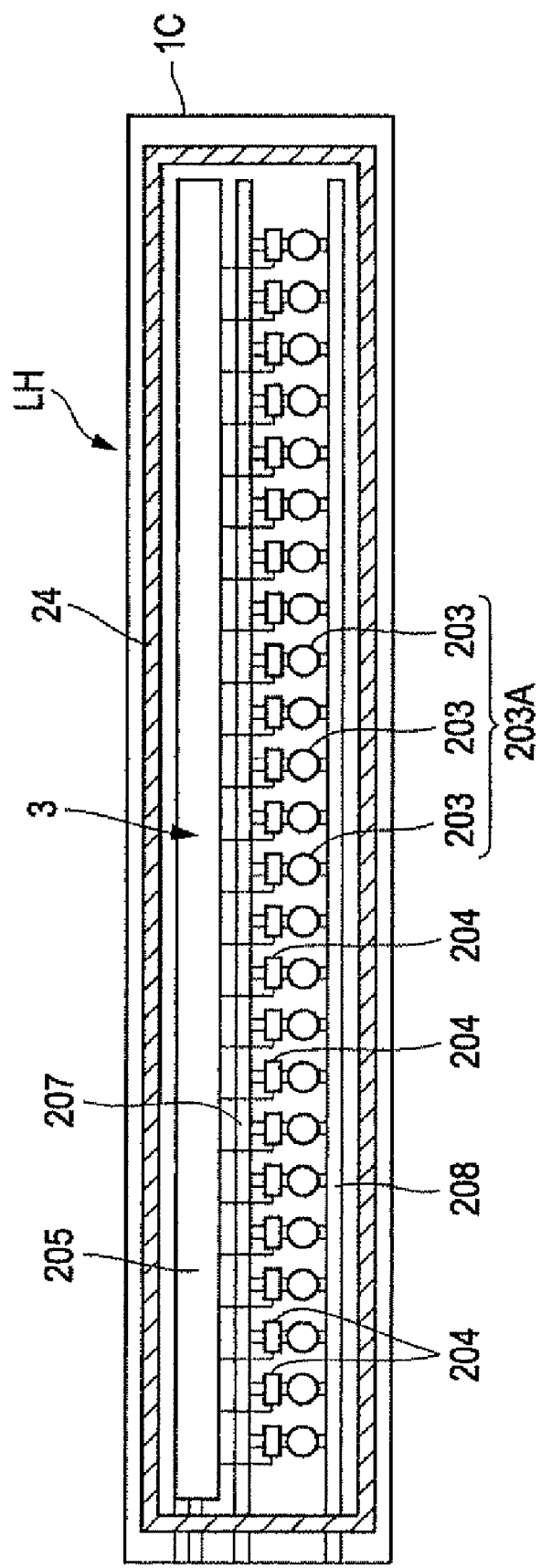
FIG. 15 is a view schematically showing the line head according to the sixth embodiment of the invention.

FIG. 13 is a view showing the outline structure of an image forming device equipped with the line head according to the sixth embodiment of the invention. FIG. 14 is a perspective cross-sectional view of a head module according to the sixth embodiment of the invention. FIG. 15 is a view schematically showing the line head according to the sixth embodiment of the invention. The same components as those of the above embodiments are designated with the same reference numerals, and thus the descriptions thereof are omitted.

As shown in FIG. 13, an image forming device IM contains a head device 200 used as an exposure unit, a photo conductor drum 209, a corona charging unit 242 that uniformly charges the outer peripheral surface of the photo conductor drum 209, a developing device 244 that supplies a toner as a developer to an electrostatic latent image formed with the head device 200 to form a toner image, a transfer roller 245 that transfers the toner image developed with the developing device 244, a pressurizing roller 266 that transfers the toner image to a recording medium P between the pressurizing roller 266 and the transfer roller 245, a fixing unit 261 that fixes the toner image to the recording medium P, a cleaning device 246 as a cleaning unit that removes the toner remaining on the surface of the photo conductor drum 209 after transferring, and a controller (not shown) that controls, for example, rotation driving of the photo conductor drum 209 and driving of the head device 200.

The photo conductor drum 209 has a structure in which a photosensitive layer as an image support containing an organic material or an inorganic material is provided to the outer peripheral surface of a base containing a conductive substance. The photo conductor drum 209 is exposed with light from the head device 200 while rotating clockwise, in FIG. 13, to form a latent image. The position in the direction of rotation is detected by an encoder 209A, and is output to the controller. The rotation driving of the photo conductor drum 209 is controlled by a rotation driving device 209B under the control of the controller.

The developing device 244 uses a nonmagnetic monocomponent toner as a developer, for example. The monocomponent developer is transported to a developing roller is regulated with a feed roller, for example, the film thickness of the developer adhering to the surface of the developing roller by a regulating blade, the developing roller is brought into contact with or pressed against the photo conductor drum 209, whereby the developer is made to adhere according to the potential level of the photo conductor drum 209 to obtain a toner image by development.

The head device 200 contains head modules (line head modules) 201 and 202 which are disposed at an interval between the corona charging unit 242 and the developing device 244 along the peripheral surface of the photo conductor drum 209. These head modules 201 and 202 each are disposed along a generating line of the photo conductor drum 209.

As shown in FIG. 14, the line head modules 201 and 202 of this embodiment contain a line head LH in which a plurality of organic EL elements are aligned, an SL array (lens array) 231 in which lens elements for forming an erect equally-sized image with light from the line head LH with equal magnification are aligned, and a head case 252 which supports peripheries of the line head LH and the SL array 231. The line head LH and the SL array 231 are supported by the head case 52 in the state where the line head LH and the SL array 231 are aligned with each other. Thus, the SL array 231 is arranged to form the erect equally-sized image on a later-described photosensitive drum with the light from the line head LH.

As shown in FIG. 15, the line head LH has an element substrate 1C, the sealing substrate 2C shown in FIG. 6, and the light emitting unit 3 held between the element substrate 1C and the sealing substrate 2C. The light emitting unit 3 is formed on the element substrate 1C and contains a light emitting element column 203A, a driving element group, and a control circuit group 205. The light emitting element column 203A, the driving element group, and the control circuit group 205 are integrally formed on the element substrate 1C.

The light emitting element column 203A contains a plurality of organic EL elements 203 as a light emitting element. The driving element group contains a driving element 204 that drives the organic EL element 203. The control circuit group 205 controls driving of the driving element 204 based on the control of the controller as a light emission controller.

Although the light emitting element column 203A is formed with a single column of organic EL devices 203 in FIG. 15, the light emitting element column 203A may be formed with two columns of organic EL devices 203 in a shape of zigzag.

The shape of the element substrate 1C is a long and narrow rectangular shape, and the horizontal and vertical length is the same as that of the sealing substrate 2C shown in FIG. 6. More specifically, in the element substrate 1C, the length (length of a long side) in the longitudinal direction is 330 mm, for example, and the length (length of a short side) in the transverse direction is 10 to 20 mm, for example. In the line head LH of this embodiment, the element substrate 1C and the sealing substrate 2C are sealed by the sealing portion 24.

The organic EL element 203 has at least an organic light emitting layer between a pair of electrodes, and emits light by supplying a current to a light emitting layer from the pair of electrodes. In the organic EL element 203, a source line 208 is connected to one electrode and a source line 207 is connected to the other electrode through the driving element 204. The driving element 204 contains a switching element, such as a thin film transistor (TFT) or a thin film diode (TFD). When a TFT is employed as the driving element 204, the source line 208 is connected to the source area and the control circuit group 205 is connected to a gate electrode. Then, the operation of the driving element 204 is controlled by the control circuit group 205, and the electrical connection to the organic EL element 203 is controlled by the driving element 204.

Furthermore, as shown in FIG. 15, the sealing portion 24 having a rectangular shape is disposed at the periphery of the element substrate 1C. The sealing portion 24 is held between the sealing substrate 2C and the element substrate 1C, and prevents moisture or oxygen from entering the inside of the line head LH. The sealing portion 24 contains the sealing glass portions 24A and the sealing resin portions 24B. In particular, in the case where the element substrate 1C and the sealing substrate 2C in which the long side is very long relative to the short side as in the line head LH of this embodiment, the sealing glass portions 24A alone are provided to the short side in which an external stress is hard to generate and the sealing glass portions 24A and the sealing resin portions 24B are provided to the long side in which an external stress easily generates, and thus the sealing resin portions 24B reduce an external stress. Therefore, in the line head LH, high sealing properties are obtained and excellent resistance against an external stress is obtained.

As described above, the embodiments of the invention are described in detail, but the invention can be practiced with modification and alteration within the technical scope of the invention.

The entire disclosure of Japanese Patent Application No. 2008-106720, filed Apr. 16, 2008 is expressly incorporated by reference herein.

What is claimed is:

1. An organic electroluminescence device, comprising:
   an element substrate;
   a light emitting unit formed above the element substrate;
   a sealing substrate; and
   a sealing portion surrounding at least the light emitting unit and disposed between the element substrate and the sealing substrate, the sealing portion having sealing glass portions and sealing resin portions, wherein
   the sealing portion is formed into a rectangular shape in plan view, and
   the sealing resin portions are disposed between adjacent sealing glass portions in plan view.

2. The organic electroluminescence device according to claim 1, wherein the sealing resin portion is provided to at least one portion in each of two sides facing each other of the sealing portion formed into the rectangular shape.

3. The organic electroluminescence device according to claim 1, wherein the sealing portion formed into the rectangular shape has long sides facing each other and short sides facing each other; and
   the sealing resin portion is provided to at least one portion in each of the long sides.

4. The organic electroluminescence device according to claim 1, wherein the sealing resin portion is provided to at least one portion of each of four sides of the sealing portion formed into the rectangular shape.

5. The organic electroluminescence device according to claim 1, wherein the sealing resin portions are provided to four corners of the sealing portion formed into the rectangular shape.

6. The organic electroluminescence device according to claim 1, wherein the sealing resin portions are formed at a center of each side of the sealing portion such that the sealing glass portions are equal in length.

7. The organic electroluminescence device according to claim 1, wherein a desiccant is disposed in a space sealed by the sealing portion between the element substrate and the sealing substrate.

8. A method for producing an organic electroluminescence device, comprising:
   forming a light emitting unit above an element substrate;
   forming sealing glass portions on a sealing substrate at a given interval;
   bonding the element substrate and the sealing substrate in such a manner that a side of the element substrate on which the light emitting unit is formed faces the sealing substrate; and
   forming sealing resin portions between the sealing glass portions which are adjacent to each other in the state where the element substrate and the sealing substrate are bonded to each other, wherein a sealing portion including the sealing glass portions and sealing resin portions define a rectangular shape in plan view, and the sealing resin portions are disposed between adjacent sealing glass portions in plan view.

9. The method for producing an organic electroluminescence device according to claim 8, wherein the process of forming the sealing glass portions on the sealing substrate includes disposing glass resin material containing a glass material at a given interval on the sealing substrate, and then curing the glass resin material.

10. The method for producing an organic electroluminescence device according to claim 8, wherein the process of bonding the element substrate and the sealing substrate includes melt-bonding the element substrate and the sealing substrate to each other by irradiating the sealing glass portions with laser light in the state where the element substrate and the sealing substrate are bonded to each other.

11. The method for producing an organic electroluminescence device according to claim 10, wherein the sealing glass portions are colored.

12. The method for producing an organic electroluminescence device according to claim 10, wherein the sealing glass portions contain a transition metal.

13. The method for producing an organic electroluminescence device according to claim 8, wherein the process of forming the sealing resin portions includes disposing liquid resin adhesive between the sealing glass portions which are adjacent to each other, and curing the resin adhesive.

* * * * *